US008143921B2

United States Patent
Neto et al.

(10) Patent No.: US 8,143,921 B2
(45) Date of Patent: Mar. 27, 2012

(54) LATCHED COMPARATOR AND METHODS THEREFOR

(75) Inventors: Fernando Z. Neto, Campina (BR); Fernando Chavez Porras, Campinas (BR); Jon S. Choy, Austin, TX (US); Walter Luis L. Tercariol, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 409 days.

(21) Appl. No.: 12/534,409

(22) Filed: Aug. 3, 2009

(65) Prior Publication Data

US 2011/0025379 A1    Feb. 3, 2011

(51) Int. Cl.
*H03K 5/22* (2006.01)

(52) U.S. Cl. ............. 327/67; 327/64; 327/65; 327/57

(58) Field of Classification Search .............. 327/54–57, 327/63–67
See application file for complete search history.

(56) References Cited

U.S. PATENT DOCUMENTS

| 6,480,128 | B1 | 11/2002 | Bach et al. | |
|---|---|---|---|---|
| 6,559,787 | B1 | 5/2003 | Aude et al. | |
| 6,940,316 | B2* | 9/2005 | Wakamatsu et al. | 327/57 |
| 7,002,505 | B2 | 2/2006 | Hughes | |
| 7,679,406 | B2* | 3/2010 | Yagi | 327/65 |
| 7,800,411 | B1* | 9/2010 | Mohan | 327/57 |
| 2004/0075472 | A1* | 4/2004 | Jansson | 327/65 |

* cited by examiner

*Primary Examiner* — Long Nguyen (57) ABSTRACT

A compare cycle of a comparator includes a precharge phase and a compare phase. During the precharge phase, a node of the comparator is precharged to a defined voltage. In addition, during the precharge phase an input transistor of the comparator is decoupled from the node. During the compare phase, an input voltage is coupled to the node via the input transistor. The input transistor is maintained in saturation during both the precharge phase and the compare phase, reducing switching noise.

20 Claims, 5 Drawing Sheets

LATCHED COMPARATOR AND METHODS THEREFOR

BACKGROUND

1. Field of the Disclosure

The present disclosure relates generally to electronic devices, and more particularly, to comparator devices.

2. Description of the Related Art

A comparator is an electronic device that is used to compare the relative level, such as the voltage level or current level, of two signals, and to provide an indication at an output of the comparator of which signal has the greater level. Accordingly, the comparator can be used to indicate when the level of a signal of interest exceeds a predetermined reference level, thereby allowing regulation of the signal of interest. For example, a voltage regulator may control the conductivity of a transistor in order to maintain a supply voltage at a desired level based on the output of a comparator configured to compare the supply voltage to a reference voltage.

One example of a comparator, referred to as a latching comparator, includes a latch portion configured to latch a value based on the comparison of input signals. One or more control signals are employed to manipulate switches at the comparator to control when the comparator samples the signals at the input in order to perform a comparison, and when a value based on the comparison is latched at the comparator. However, the manipulation of the switches can introduce undesirable noise, referred to as kickback noise, at one or both inputs of the comparator. Kickback noise can limit the precision with which the comparator can compare the input signals.

BRIEF DESCRIPTION OF THE DRAWINGS

The present disclosure may be better understood, and its numerous features and advantages made apparent to those skilled in the art by referencing the accompanying drawings.

DETAILED DESCRIPTION

A compare cycle of a latching comparator includes a precharge phase and a compare phase. During the precharge phase, a node of the comparator is precharged to a defined voltage. In addition, during the precharge phase an input transistor of the comparator is decoupled from the node. During the compare phase, an input voltage is coupled to the node via the input transistor. The input transistor is maintained in saturation during both the precharge phase and the compare phase, reducing switching noise.

Figure 1:
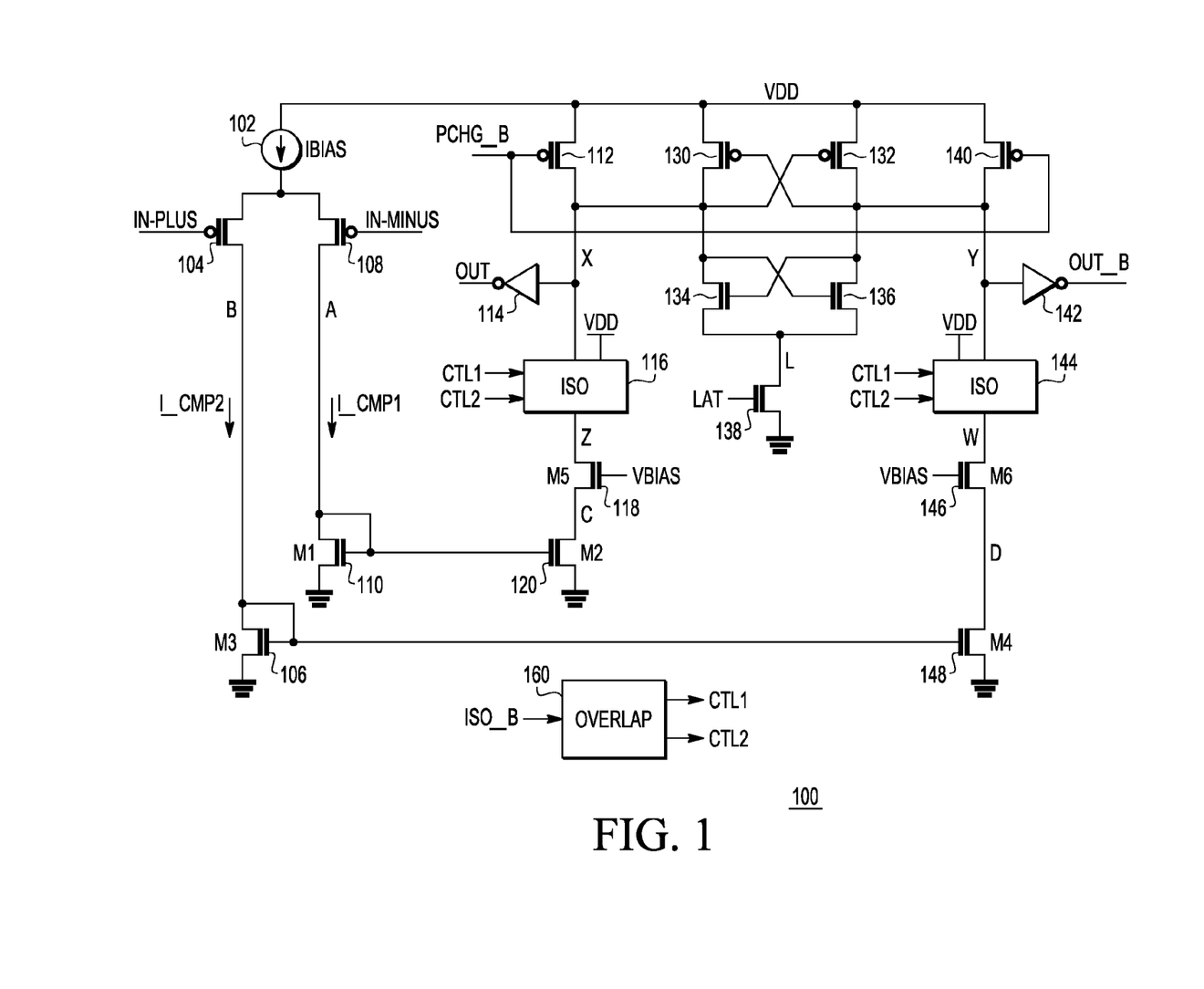
FIG. 1 illustrates in partial block diagram and partial schematic form, a latched voltage comparator in accordance with a specific embodiment of the present disclosure.

FIG. 1 illustrates in partial block diagram and partial schematic form a latched voltage comparator 100 in accordance with a specific embodiment of the present disclosure. Voltage comparator 100 includes a current source 102, p-channel metal oxide semiconductor (PMOS) transistors 104, 108, 112, 130, 132, and 140, n-channel metal oxide semiconductor (NMOS) transistors 106, 110, 118, 120, 134, 136, 138, 146, and 148, inverters 114 and 142, isolation modules 116 and 144, and a overlap module 160.

Current source 102 has a first current electrode connected to a supply voltage labeled "VDD," a second current electrode, and is operable to supply a current labeled "IBIAS." PMOS transistor 104 has a source connected to the second current electrode of current source 102, a gate electrode connected to a node labeled "IN_PLUS," and a drain connected to a node labeled "B." A current conducted at node B is labeled "I_CMP2." NMOS transistor 106 has a drain connected to node B, a gate connected to node B, and a source connected to a ground supply voltage. PMOS transistor 108 has a source connected to the second current electrode of current source 102, a gate electrode connected to a node labeled "IN_MINUS," and a drain connected to a node labeled "A." A current conducted at node A is labeled "I_CMP1." NMOS transistor 110 has a drain connected to node A, a gate connected to node A, and a source connected to ground.

PMOS transistor 112 has a source connected to node VDD, a gate connected to a node labeled "PCHG_B," and a drain connected to a latch node labeled "X." Inverter 114 has an input connected to node X and an output connected to a node labeled "OUT." Isolation module 116 has a first terminal connected to latch node X, a second terminal connected to supply voltage VDD, and a third terminal connected to a node labeled "Z." NMOS transistor 118 has a drain connected to node Z, a gate connected to a node labeled "VBIAS," and a drain connected to node C. NMOS transistor 120 has a drain connected to node C, a gate connected to node A, and a source connected to ground.

PMOS transistor 130 has a source connected to voltage supply VDD, a gate connected to a latch node labeled "Y," and a drain connected to latch node X. NMOS transistor 134 has a drain connected to latch node X, a gate connected to latch node Y, and a source connected to a node labeled "L." PMOS transistor 132 has a source connected to voltage supply VDD, a gate connected to latch node X, and a drain connected to latch node Y. NMOS transistor 136 has a drain connected to latch node Y, a gate connected to latch node X, and a source connected to node L. NMOS transistor 138 has a drain connected to node L, a gate connected to a node labeled "LAT," and a source connected to ground.

PMOS transistor 140 has a source connected to node VDD, a gate connected to a node labeled "PCHG_B," and a drain connected to latch node Y. Inverter 142 has an input connected to latch node Y and an output connected to a node labeled "OUT_B." Isolation module 144 has a first terminal connected to latch node Y, a second terminal connected to supply voltage VDD, and a third terminal connected to a node labeled "W." NMOS transistor 146 has a drain connected to node W, a gate connected to node VBIAS, and a source connected to node D. NMOS transistor 148 has a drain connected to node D, a gate connected to node B, and a source connected to ground.

For purposes of discussion, current source 102, PMOS transistors 104 and 108, and NMOS transistors M3 and M1 together form a differential preamplifier. During operation, current IBIAS is distributed between current I_CMP2 and current I_CMP1 based on the level of voltage signals received at input nodes IN_PLUS and IN_MINUS, respectively. For example, when the potential at input node IN_PLUS is greater than the potential at input node IN_MINUS, the magnitude of current I_CMP2 will be smaller than the magnitude of current I_CMP1.

The gates of NMOS transistor 110 and NMOS transistor 120 are connected together, and thus together implement a current mirror to mirror the current I_CMP1. Therefore, a current conducted by NMOS transistor 120 is controlled by current I_CMP1 conducted at node A. Cascode connected NMOS transistor 118 is configured to increase the output impedance of the current mirror formed by NMOS transistor 110 and 120. Similarly, the gates of NMOS transistor 106 and NMOS transistor 148 are connected together, and thus together implement a current mirror to mirror the current I_CMP2. Therefore, a current conducted by NMOS transistor 148 is controlled by a current I_CMP2 conducted at node B. Cascode connected NMOS transistor 146 is configured to increase the output impedance of the current mirror formed my NMOS transistor 106 and 148.

PMOS transistors 130 and 132, and NMOS transistors 134, 136, and 138 form a latch circuit. In particular, in response to assertion of the signal LAT, transistors 130 and 132, and transistors 134, 136, and 138 latch a value based on the relative voltages at nodes X and Y.

Isolation module 116 is configured to couple node Z to one of VDD and node X based on the control signals CTL1 and CTL2. Similarly, isolation module 144 is configured to couple node W to one of VDD and node Y based on the control signals CTL1 and CTL2.

In operation, latching comparator 100 is configured to compare IN_PLUS and IN_MINUS based on a series of operational intervals, including a precharge interval, a compare interval, and a latch interval. For purposes of discussion, each series of precharge interval, compare interval, and latch interval is referred to as a compare cycle. During the precharge interval of a compare cycle, nodes X and Y are precharged to a potential of approximately the same as voltage supply VDD by PMOS transistors 112 and 140, respectively, when a signal provided at node PCHG_B is at a logic-low potential. Further, during the precharge interval, signals CTL1 and CTL2 are set such that isolation module 116 and isolation module 144 couple nodes Z and W, respectively to the supply voltage VDD.

The precharge interval of the compare cycle is followed by a compare interval. During the compare interval, the isolation module 116 and isolation module 144 signals CTL1 and CTL2 are set such that isolation module 116 and isolation module 144 couple nodes Z and W respectively to nodes X and Y. Accordingly, during the compare interval, the voltage at node X will be based on the current through transistors 118 and 120, which in turn is based on the current I_CMP1. Similarly, during the compare cycle, the voltage at node Y will be based on the current through transistors 146 and 148, which in turn is based on the current I_CMP2. Thus, during the compare interval the nodes X and Y are driven to voltages based on the voltages IN_MINUS and IN_PLUS, respectively.

The compare interval of a compare cycle is followed by a latch interval. During the latch interval, the signal LAT is asserted so that NMOS transistor 138 becomes more conductive, causing the latch circuit to assume one of two binary states based on the relative magnitude of voltages at node X and node Y. The state of the latch circuit is reflected at the mutually exclusive output nodes OUT and OUT_B.

Because isolation module 116 and isolation module 144 are configured to couple nodes Z and W, respectively, to VDD during the precharge phase, NMOS transistors 118, 120, 146 and 148 are maintained in saturation mode during all intervals of a compare cycle. In an embodiment, a transistor is in saturation mode when a voltage is applied to a first current electrode (such as the drain) of the transistor so that $V_{DS} > (V_{GS} - V_t)$, where $V_{DS}$ is a drain-source voltage of the transistor, $V_{GS}$ is a gate-source voltage of the transistor, and $V_t$ is a threshold voltage of the transistor. By maintaining transistors 118, 120, 146 and 148 in saturation mode, kickback noise at the latching comparator 100 is reduced. This can be better understood with references to FIGS. 2-6. In another embodiment, NMOS transistors 118, 120, 146 and 148 are configured such that the drain-to-source voltage for one or more of the transistors is as follows: $V_{DS} > 1.5*(V_{GS} - V_t)$ where $V_{DS}$ is a drain-source voltage of the transistor, $V_{GS}$ is a gate-source voltage of the transistor, and $V_t$ is a threshold voltage of the transistor. In still another embodiment, transistors 118, 120, 146 and 148 are configured such that the drain-to-source voltage for one or more of the transistors is as follows: $V_{DS} > 2*(V_{GS} - V_t)$.

Figure 2:
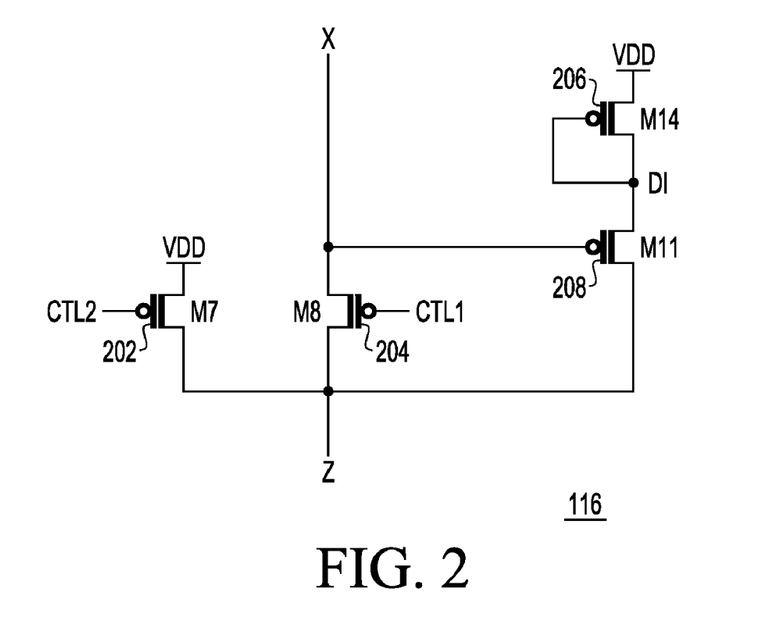
FIG. 2 is a schematic diagram illustrating the isolation circuit of the latched voltage comparator of FIG. 1 in accordance with a specific embodiment of the present disclosure.

FIG. 2 is a schematic diagram illustrating isolation module 116 of latched voltage comparator 100 in accordance with a specific embodiment of the present disclosure. Isolation module 116 is similar to isolation module 144. Isolation module 116 includes PMOS transistors 202, 204, 206, and 208. PMOS transistor 202 has a source connected to voltage supply signal VDD, a gate connected to node CTL2, and a drain connected to node Z. PMOS transistor 204 has a source connected to node X, a gate connected to node CTL1, and a drain connected to node Z. PMOS transistor 206 has a source connected to voltage supply signal VDD, a gate connected to node DI, and a drain also connected to node DI. PMOS transistor 208 has a source connected to node DI, a gate connected to node X, and a drain connected to node Z.

Isolation module 116 is configured to isolate latch node X from node Z during the precharge interval and the latch interval, and to provide a conductive path between latch node X and node Z during the compare interval. Furthermore, isolation module 116 is configured to maintain NMOS transistor 118 and NMOS transistor 120 in saturation mode during all intervals of operation of latched voltage comparator 100.

During the precharge interval and latch interval, PMOS transistor 202 is activated in response to the negation of a signal conducted at node CTL2. PMOS transistor 202 maintains node Z at a potential that is substantially equal to the potential provided by voltage supply VDD. Node VBIAS (FIG. 1) is maintained at a potential equal to approximately twice the threshold voltage of NMOS transistor 118. Thus, NMOS transistor 118 and NMOS transistor 120 are both operating in saturation mode during the precharge interval and the latch interval.

During the compare interval, PMOS transistor 204 is activated in response to the negation of a signal conducted at node CTL1, and a short time thereafter, PMOS transistor 202 is deactivated in response to the assertion of the signal conducted at node CTL1. At this time, current is permitted to flow between latch node X (FIG. 1), which has been previously precharged, and node Z based on the conductivity of NMOS transistor 120. As previously described, the conductivity of NMOS transistor 120 is determined by current I_CMP1. During the compare interval, either latch node X or latch node Y will transition from the precharged (logic-high) state to a logic-low state. If latch node X transitions to a logic-low state based on current conducted by NMOS transistors 120, NMOS transistor 118, and PMOS transistor 204, PMOS transistor 208 will transition from a deactivated state to an activated state. Thus, PMOS transistor 208 and PMOS transistor 206 are configured to maintain node Z at a voltage adequate to maintain NMOS transistor 118 (FIG. 1) and NMOS transistor 120 (FIG. 1) in saturation mode. Specifically, the approximate potential at node Z in this situation is defined by the equation:

$$Vz = Vdd - (|Vt(M14)| + |Vdsat(M14)| + |Vt(M11)| + |Vdsat(M11)|)$$

Where Vdd is the potential provided by voltage supply VDD, Vt(M14) is the threshold voltage of PMOS transistor 206, Vdsat(M14) is the saturation voltage of PMOS transistor 206, Vt(M11) is the threshold voltage of PMOS transistor 208, Vdsat(M11) is the saturation voltage of PMOS transistor 208.

Maintaining NMOS transistor 118 and NMOS transistor 120 in saturation mode during all intervals of operation of latched voltage comparator 100 reduces kickback noise generated by the activation and deactivation of PMOS transistor 204 from coupling to input node IN_MINUS. In particular, if NMOS transistor 118 and NMOS transistor 120 were permitted to operate in a triode region when signal CTL1 transitions, gate-to-source overlap capacitance at NMOS transistor 120 would be increased, and a greater amount of charge-injection noise at node Z (caused by a transitions at node CTL1) would be coupled back to input node IN_MINUS. As explained further with respect to FIGS. 3 and 4, signals at nodes CTL1 and CTL2 can be configured to momentarily overlap, thus assuring that PMOS transistor 202 remains activated when PMOS transistor 204 is activated and deactivated.

The operation of isolation module 144 is similar to the operation of isolation module 116. Specifically, isolation module 144 is configured to isolate latch node Y from node W during the precharge interval and the latch interval, and to provide a conductive path between latch node Y and node W during the compare interval. Furthermore, isolation module 144 is configured to maintain NMOS transistor 146 and NMOS transistor 148 in saturation mode during all intervals of operation of latched voltage comparator 100.

Figure 3:
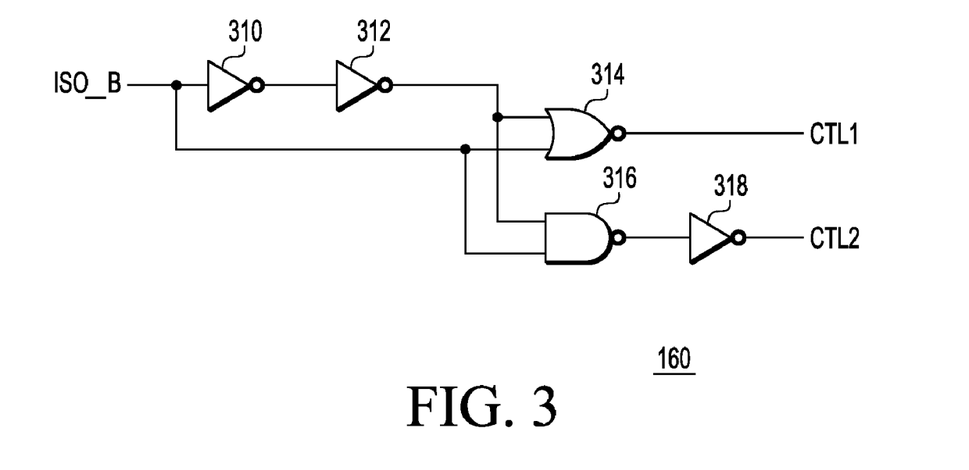
FIG. 3 is a schematic diagram illustrating the overlap module of latched voltage comparator of FIG. 1 in accordance with a specific embodiment of the present disclosure.

FIG. 3 is a schematic diagram illustrating overlap module 160 of latched voltage comparator 100 of FIG. 1 in accordance with a specific embodiment of the present disclosure. Overlap module is configured to generate signals conducted by node CTL1 and CTL2, and includes inverters 310, 312, and 318, NOR gate 314, and NAND gate 316. Inverter 310 has an input connected to node ISO_B and an output connected to an input of inverter 312. Inverter 312 has an output connected to an input of NOR gate 314 and an input of NAND gate 316. NOR gate 314 has another input connected to node ISO_B, and an output connected to node CTL1. NAND gate 316 has another input connected to node ISO_B, and an output connected to node an input of inverter 318. Inverter 318 has an output connected to node CTL2. The operation of overlap module 160 as illustrated by FIG. 3 can be better understood with reference to FIG. 4.

Figure 4:
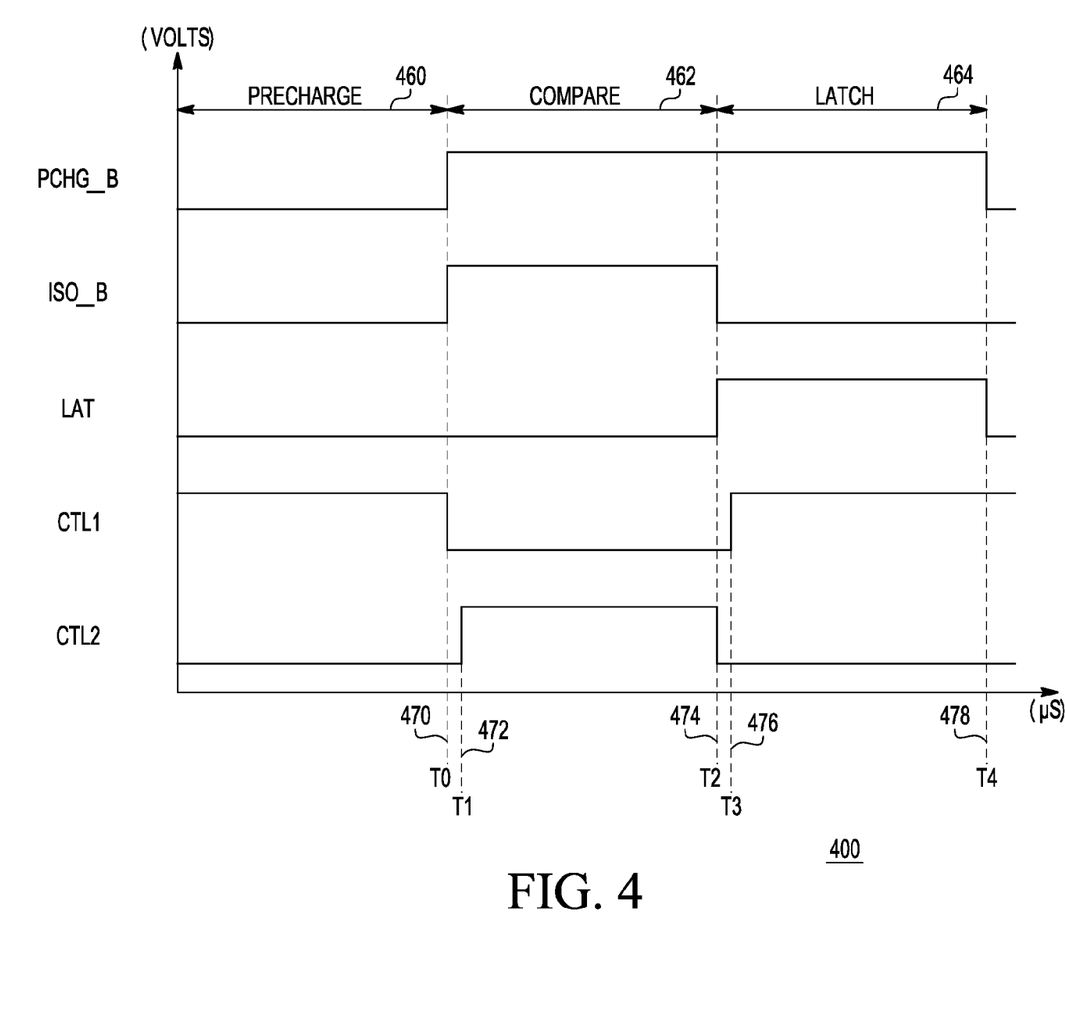
FIG. 4 is a timing diagram illustrating the operation of the latched voltage comparator of FIG. 1 in accordance with a specific embodiment of the present disclosure.

FIG. 4 is a timing diagram 400 illustrating the operation of latched voltage comparator 100 of FIG. 1 in accordance with a specific embodiment of the present disclosure. Timing diagram 400 includes a horizontal axis representing time and a vertical axis representing voltage. Timing diagram 400 illustrates a waveform 420 representing a signal conducted at node PCH_B, a waveform 430 representing a signal conducted at node ISO_B, a waveform 440 representing a signal conducted at node CTL1, and a waveform 450 representing a signal conducted at node CTL2. Timing diagram 400 also includes an interval 460 labeled "PRECHARGE," an interval 462 labeled "COMPARE," an interval 464 labeled "LATCH," a time reference 470 labeled "T0," a time reference 472 labeled "T1," a time reference 474 labeled "T2," a time reference 476 labeled "T3," and a time reference 478 labeled "T4."

Waveform 410 transitions from a logic-low level to a logic-high level at time reference 470, and transitions back to a logic-low level at time reference 478. Waveform 420 transitions from a logic-low level to a logic-high level at time reference 470, and transitions back to a logic-low level at time reference 474. Waveform 430 transitions from a logic-low level to a logic-high level at time reference 474, and transitions back to a logic-low level at time reference 478. Nodes PCHG_B, ISO_B, and LAT are primary inputs of latched voltage comparator 100. Waveform 440 transitions from a logic-high level to a logic-low level at time reference 470, and transitions back to a logic-high level at time reference 476. Waveform 450 transitions from a logic-low level to a logic-high level at time reference 472, and transitions back to a logic-low level at time reference 474. Each of signals at nodes CTL1 and CTL2 is provided by overlap module 160 in response to a transition of a signal at node ISO_B.

Interval 460 represents a precharge interval. During the precharge interval, each of latch node X and latch node Y is precharged to a logic-high level in response to an assertion of a signal conducted at node PCHG_B. Interval 462 represents a compare interval. Furthermore, each of NMOS transistor 118 and NMOS transistor 120 is maintained in saturation mode by PMOS transistor 202 of isolation module 116 in response to an assertion of a signal conducted at node CTL2. During the compare interval, a current path between the current mirror implemented by NMOS transistor 110 and NMOS transistor 120 is established by PMOS transistor 204 in response to the assertion of a signal conducted at node CTL1 at isolation module 116. Similarly, a current path between the current mirror implemented by NMOS transistor 106 and NMOS transistor 148 is established by PMOS transistor 204 in response to the assertion of a signal conducted at node CTL1 at isolation module 144. Furthermore, each of NMOS transistor 118 and NMOS transistor 120 is maintained in saturation mode by PMOS transistor 206 and PMOS transistor 208 of isolation module 116 in the event that latch node X transitions to a logic-low level. Similarly, each of NMOS transistor 146 and NMOS transistor 148 is maintained in saturation mode by PMOS transistor 206 and PMOS transistor 208 of isolation module 144 in the event that latch node Y transitions to a logic-low level.

Interval 464 represents a latch interval. During the latch interval, NMOS transistor 138 is activated by the assertion of a signal conducted at node LAT, and one of latch node X or latch node Y will transition to a logic-low level, while the alternative latch node will remain at a logic-high (precharged) level. The determination of which latch node will transition to a logic-low level is based on which of nodes IN_PLUS and IN_MINUS is at a greater potential immediately before and during compare interval 462, as previously described. Note that a signal conducted at node CTL2 remains negated for a short period of time after a signal conducted at node CTL1 is negated. Similarly, the signal conducted at node CTL1 remains negated for a short period of time after a signal conducted at node CTL2 is negated. Thus, NMOS transistor 118 and NMOS transistor 120 are maintained in saturation mode during all intervals of operation of latched voltage comparator 100. Similarly, NMOS transistor 146 and NMOS transistor 148 are maintained in saturation mode during all intervals of operation of latched voltage comparator 100.

Figure 5:
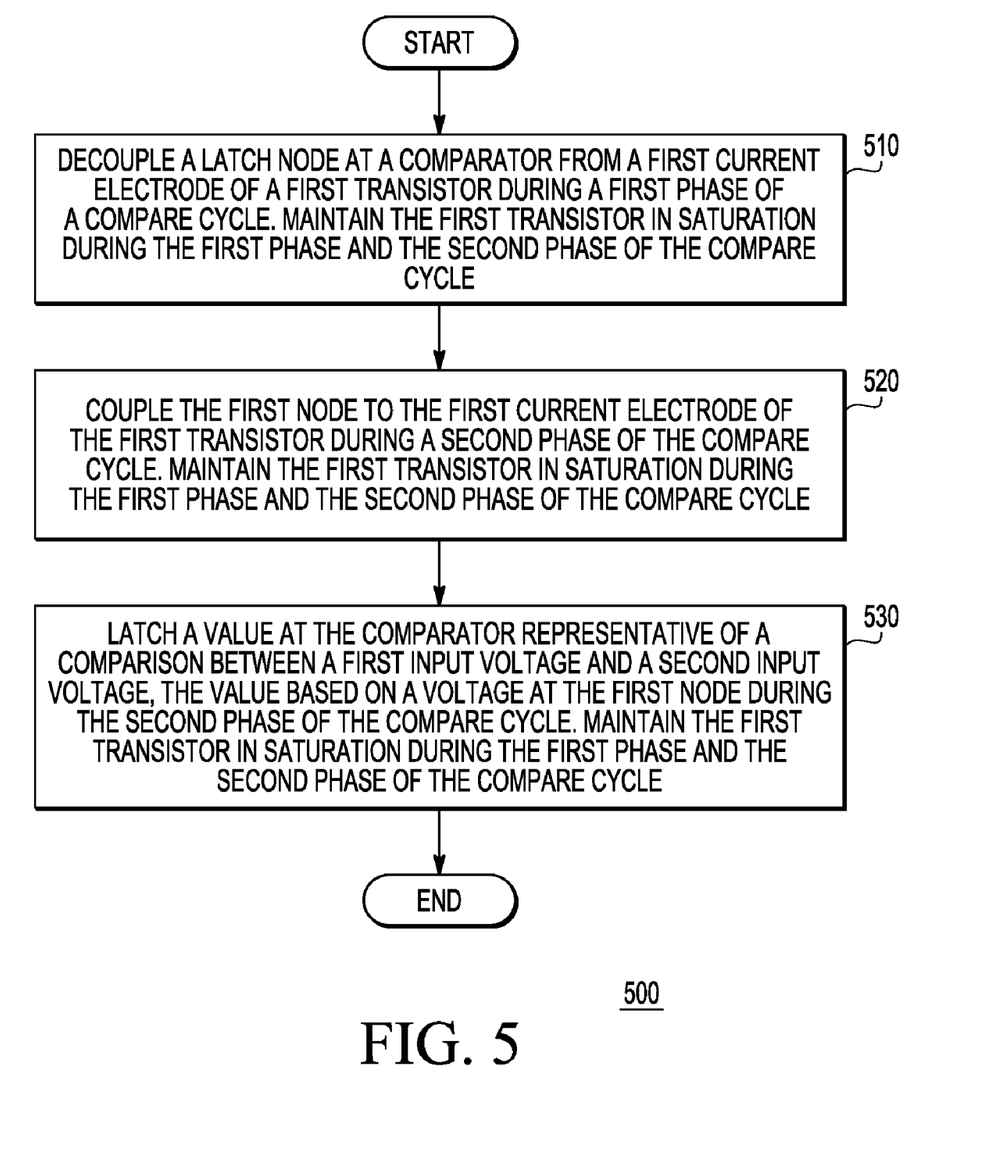
FIG. 5 is a flow chart illustrating the operation of the latched voltage comparator of FIG. 1 in accordance with a specific embodiment of the present disclosure.

FIG. 5 is a flow chart illustrating the operation of latched voltage comparator 100 of FIG. 1 in accordance with a specific embodiment of the present disclosure. The flow starts at block 510 where a latch node at a comparator is decoupled from a first current electrode of a first transistor during a first phase of a compare cycle by deactivating PMOS transistor 204 at isolation module 116 and isolation module 144, in response to the negation of a signal at node CTL1 during a precharge interval. The first transistor, e.g. NMOS transistors 118, 120, 146, and 148 are maintained in saturation mode. The flow continues at block 520 where the latch node is electrically connected to the first current electrode of the first transistor during a second phase of the compare cycle by activating PMOS transistor 204 at isolation module 116 and isolation module 144, in response to the assertion of a signal at node CTL1 during a compare interval. Each of NMOS transistors 118, 120, 146, and 148 is maintained in saturation mode. The flow continues at block 530 where a value is latched at the comparator representative of a comparison between a first input voltage and a second input voltage. The value is based on a voltage at the first node during the second phase of the compare cycle, in response to the assertion of a signal at node LAT during a latch interval. Each of NMOS transistors 118, 120, 146, and 148 is maintained in saturation mode.

Figure 6:
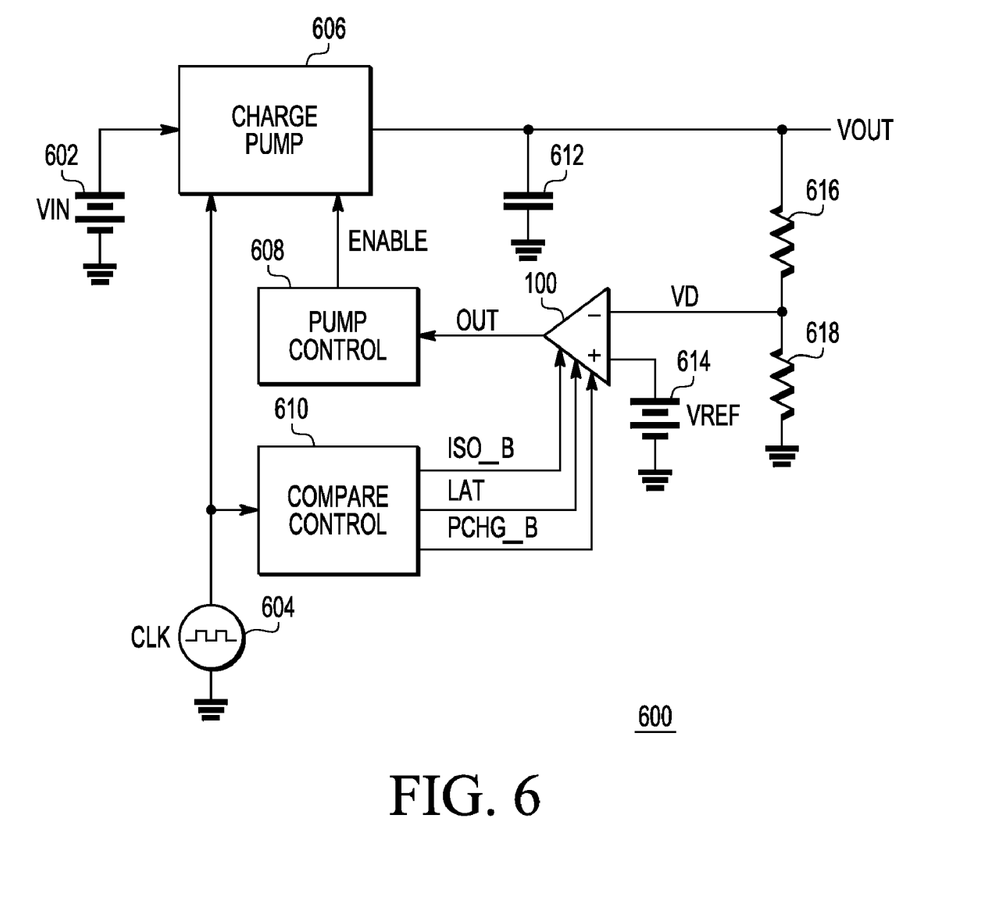
FIG. 6 is a block diagram illustrating a regulated charge pump device including the latched voltage comparator of FIG. 1 in accordance with a specific embodiment of the present disclosure.

FIG. 6 is a block diagram illustrating a regulated charge pump device 600 including latched voltage comparator 100 of FIG. 1 in accordance with a specific embodiment of the present disclosure. Latched voltage comparator 100 is configured to operate in a feedback configuration to maintain an output voltage at a substantially constant level. Regulated charge pump device 600 includes a voltage source 602, a clock generator 604, a charge pump 606, a pump control module 608, a compare control module 610, a capacitor 612, latched voltage comparator 100, a voltage reference 614, and resistors 616 and 618.

Voltage source 602, labeled "VIN," has a negative terminal connected to ground and a positive terminal connected to an input of charge pump 606. Clock generator 604, labeled "CLK," has a terminal connected to ground and another terminal connected to an input of charge pump 606. Charge pump 606 has another input connected to an output of pump control module 608 via a node labeled "ENABLE," and an output connected to a node labeled "VOUT." Capacitor 612 has a first terminal connected to ground and a second terminal connected to node VOUT. Resistor 616 has a first terminal connected to node VOUT and a second terminal connected to a node labeled "VD." Resistor 616 has a first terminal connected to node VD and a second terminal connected to ground. Voltage reference 614, labeled "VREF," has a negative terminal connected to ground and a positive terminal connected to a non-inverting input at latched voltage comparator 100. Latched voltage comparator 100 has an inverting input connected to node VD, an input connected to a node labeled "ISO_B," an input connected to a node labeled "LAT," an input connected to a node labeled PCHG_B, and an output connected to an input at pump control module 608 via a node labeled "OUT."

During operation, latched voltage comparator 100 repeatedly samples the potential at node VOUT via node VD at a voltage divider implemented by resistor 616 and resistor 618, and compares this potential to that of voltage supply 614. If the potential at node VD is less than the potential of voltage supply 614, latched voltage comparator 100 configures pump control module 608 to enable charge pump 606 to increase the potential at node VOUT. If the potential at node VD is greater than the potential of voltage supply 614, latched voltage comparator 100 configures pump control module 608 to disable charge pump 606 to decrease the potential at node VOUT. Compare control module 610 generates signals conducted at nodes PCHG_B, ISO_B, and LAT based on a clock signal provided by clock generator 604. Signals conducted at nodes PCHG_B, ISO_B, and LAT are generated sequentially as described with respect to timing diagram FIG. 4 based on the clock signal provided by clock generator 604. Thus, latched voltage comparator 100 is periodically re-evaluating whether charge pump 606 should be activated or deactivated based on a comparison of the potential at node VD and the potential at node VREF.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
   decoupling a first node of a latch at a comparator from a first current electrode of a first transistor of the comparator so that the first node is decoupled from the first current electrode during a first phase of a first compare cycle;
   coupling the first node to the first current electrode of the first transistor so that the first current electrode is coupled to the first node during a second phase of the first compare cycle;
   during the second phase of the first compare cycle latching a first value at the comparator representative of a comparison between a first input voltage and a second input voltage, the first value based on a voltage at the first node; and
   maintaining the first transistor in saturation during the first phase of the first compare cycle and the second phase of the first compare cycle.

2. The method of claim 1, wherein maintaining the first transistor in saturation comprises applying a voltage to the first current electrode of the first transistor so that $V_{DS}>(V_{GS}-V_t)$, where $V_{DS}$ is a drain-source voltage of the first transistor, $V_{GS}$ is a gate-source voltage of the first transistor, and $V_t$ is a threshold voltage of the first transistor.

3. The method of claim 1, wherein maintaining the first transistor in saturation comprises applying a voltage to the first current electrode of the first transistor so that $V_{DS}>1.5*(V_{GS}-V_t)$, where $V_{DS}$ is a drain-source voltage of the first transistor, $V_{GS}$ is a gate-source voltage of the first transistor, and $V_t$ is a threshold voltage of the first transistor.

4. The method of claim 1, wherein maintaining the first transistor in saturation comprises applying a voltage to the first current electrode of the first transistor so that $V_{DS}>2*

($V_{GS}-V_t$), where $V_{DS}$ is a drain-source voltage of the first transistor, $V_{GS}$ is a gate-source voltage of the first transistor, and $V_t$ is a threshold voltage of the first transistor.

5. The method of claim 1, wherein maintaining the first transistor in saturation comprises coupling the first current electrode of the first transistor to a reference voltage via a first circuit path during the first phase of the first compare cycle, and coupling the first current electrode of the first transistor to a reference voltage via a second circuit path during the second phase of the first compare cycle.

6. The method of claim 1, wherein maintaining the first transistor in saturation comprises increasing the conductivity of a second transistor in response to determining a decrease in voltage at the first current electrode of the first transistor.

7. The method of claim 1, further comprising:
during the second phase of the first compare cycle:
generating a first current based on the first input voltage;
generating a second current through the first node, the second current based on the first current and based on a current through the first current electrode of the first transistor;
latching a first value at the comparator representative of a comparison between the first input voltage and a second input voltage, the first value based on the second current.

8. The method of claim 1, further comprising:
decoupling a second node of the latch from a first current electrode of a second transistor so that the second node is decoupled from the first current electrode of the second transistor during the first phase of the first compare cycle;
coupling the second node to the first current electrode of the second transistor so that the second node is coupled to the first current electrode of the second transistor during the second phase of the compare cycle; and
maintaining the second transistor in saturation during the first phase and the second phase.

9. The method of claim 1, further comprising:
decoupling the first node from the first current electrode of the first transistor so that the first node is decoupled from the first current electrode during a first phase of a second compare cycle, the first phase of the second compare cycle following the second phase of the first compare cycle; and
maintaining the first transistor in saturation during the first phase of the second compare cycle.

10. The method of claim 9, further comprising:
coupling the first node to the first current electrode of the first transistor so that the first current electrode is coupled to the first node during a second phase of the second compare cycle;
during the second phase of the second compare cycle latching a second value at the comparator representative of a comparison between a third input voltage and a fourth input voltage.

11. The method of claim 9, further comprising:
maintaining the first transistor in saturation during the second phase of the second compare cycle.

12. A method, comprising:
during a first phase of a first compare cycle:
decoupling a first node of a latch at a comparator from a first current electrode of a first transistor of the comparator;
coupling the first current electrode of the first transistor to a first reference voltage via a first circuit path;
decoupling a second node of the latch from a first current electrode of a second transistor;
coupling the first current electrode of the second transistor to the first reference voltage via a second circuit path; and
during a second phase of the first compare cycle:
coupling the first node to the first current electrode of the first transistor;
decoupling the first current electrode of the first transistor from the first circuit path;
coupling the second node to the first current electrode of the second transistor;
decoupling the first current electrode of the second transistor from the second circuit path and
latching a first value at the comparator representative of a comparison between a first input voltage and a second input voltage, the first value based on a voltage at the first node and a voltage at the second node.

13. The method of claim 12, further comprising:
during the second phase of the first compare cycle, increasing current applied to the first current electrode of the first transistor in response to determining a decrease in current at the first node.

14. The method of claim 12, further comprising:
during a first phase of a second compare cycle immediately following the second phase of the first compare cycle:
decoupling the first node from the first current electrode of the first transistor; and
coupling the first current electrode of the first transistor to the first reference voltage via the first circuit path.

15. The method of claim 12, further comprising:
maintaining the first transistor in saturation during the first phase and the second phase.

16. A device, comprising:
an amplifier comprising a first input to receive a first input voltage, a second input to receive a second input voltage, and a first output to generate a first output voltage based on the first input voltage;
a first transistor comprising a first current electrode, a second current electrode, and a control electrode coupled to the first output of the amplifier;
a first switch module comprising a first terminal coupled to the first current electrode of the first transistor, a second terminal coupled to a first voltage reference, a third terminal, and a first control input configured to receive a first control signal, the switch module configured to couple the first terminal to the second terminal in response to assertion of the first control signal and to couple to the first terminal to the third terminal in response to negation of the first control signal; and
a latch comprising a first input coupled to the third terminal of the first switch module.

17. The device of claim 16, wherein the amplifier further comprises a second output to generate a second output voltage based on the second input voltage, and further comprising:
a second transistor comprising a first current electrode, a second current electrode, and a control electrode coupled to the second output of the amplifier;
a second switch module comprising a first terminal coupled to the first current electrode of the second transistor, a second terminal coupled to the first voltage reference, a third terminal, and a control input to receive the first control signal, the switch module configured to couple the first terminal to the second terminal in response to assertion of the first control signal and to couple to the first terminal to the third terminal in response to negation of the first control signal; and wherein the latch comprises a second input coupled to the third terminal of the second switch module.

18. The device of claim 17, wherein the latch comprises a control input to receive a latch signal, and wherein the latch is configured to latch a value in response to the latch signal, the value based on a comparison of a voltage at the first input of the amplifier to a voltage at the second input of the amplifier.

19. The device of claim 16, wherein the first switch module further comprises:
- a second control input configured to receive a second control signal;
- a second transistor comprising a first current electrode coupled to the first terminal, a second current electrode coupled to the second terminal, and a control electrode coupled to the first control input; and
- a third transistor comprising a first current electrode coupled to the first terminal, a second current electrode coupled to the third terminal, and a control electrode coupled to the second control input.

20. The device of claim 19, wherein the first switch module further comprises:
- a fourth transistor comprising a first current electrode coupled to the first voltage reference, a second current electrode, and a control electrode coupled to the second current electrode; and
- a fifth transistor comprising a first current electrode coupled to the second current electrode of the fourth transistor, a second current electrode coupled to the first terminal, and a control electrode coupled to the second terminal.

* * * * *